US008884715B2

United States Patent
Mu

(10) Patent No.: US 8,884,715 B2
(45) Date of Patent: *Nov. 11, 2014

(54) IMBALANCE DETECTION AND REDUCTION FOR WIDEBAND BALUN

(71) Applicant: Telefonaktiebolaget L M Ericsson (publ), Stockholm (SE)

(72) Inventor: Fenghao Mu, Hjärup (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

This patent is subject to a terminal disclaimer.

(21) Appl. No.: 13/856,465

(22) Filed: Apr. 4, 2013

(65) Prior Publication Data

US 2013/0257557 A1    Oct. 3, 2013

Related U.S. Application Data

(63) Continuation of application No. 12/957,684, filed on Dec. 1, 2010, now Pat. No. 8,436,695.

(51) Int. Cl.
*H01P 5/10* (2006.01)
*H03H 7/42* (2006.01)
*H01P 3/08* (2006.01)

(52) U.S. Cl.
CPC ...................................... *H03H 7/42* (2013.01)
USPC ............................................. 333/25; 333/238

(58) Field of Classification Search
USPC ...................... 333/25, 26, 172, 238
See application file for complete search history.

(56) References Cited

U.S. PATENT DOCUMENTS

| 6,993,087 B2 | 1/2006 | Rosnell et al. |
| 7,020,452 B1 | 3/2006 | Kobayshi |

(Continued)

FOREIGN PATENT DOCUMENTS

| JP | 9036817 A | 2/1997 |
| JP | 2006238370 A | 9/2006 |
| JP | 2009004606 A | 1/2009 |
| WO | 2010000643 A1 | 1/2010 |

OTHER PUBLICATIONS

Rotella, F. et al., "Characterization, Design, Modeling, and Model Validation of Silicon on-Wafer M:N Balun Components Under Matched and Unmatched Conditions," IEEE Journal of Solid-State Circuits, May 2006, pp. 1201-1209, vol. 41, No. 5.

(Continued)

*Primary Examiner* — Dean O Takaoka
(74) *Attorney, Agent, or Firm* — Coats & Bennett, PLLC

(57) ABSTRACT

A circuit converts a single-ended signal to differential signals that are balanced to have the same amplitudes and opposite phases relative to a reference point of the differential signals. The circuit includes a balance tunable balun, a detector, and a controller. The balance tunable balun has a primary winding, a secondary winding, a control input, and a switched resistor-capacitor (RC) network. The primary winding receives the single-ended signal and the secondary winding outputs the differential signals. The control input receives a control signal and the switched RC network controls the reference point of the differential signals responsive to this control signal. The detector detects the output imbalance and the controller generates the control signal to control the switched RC network to effectively adjust the reference point as needed to reduce that output imbalance. The circuit produces well balanced differential signals over a wide range of signal frequencies.

24 Claims, 10 Drawing Sheets

(56) References Cited

U.S. PATENT DOCUMENTS

| | | | |
|---|---|---|---|
| 7,129,803 B2 | 10/2006 | Khorram et al. | |
| 7,269,391 B2 | 9/2007 | Chiu et al. | |
| 8,294,514 B2 * | 10/2012 | Visser et al. | 330/2 |
| 8,436,695 B2 * | 5/2013 | Mu | 333/25 |
| 2005/0043007 A1 | 2/2005 | Rofougaran et al. | |
| 2006/0001487 A1 | 1/2006 | Petrovic et al. | |
| 2009/0039977 A1 | 2/2009 | Lee et al. | |
| 2011/0299431 A1 | 12/2011 | Mikhemar et al. | |

OTHER PUBLICATIONS

Long, J., "Monolithic Transformers for Silicon RF IC Design," IEEE Journal of Solid-State Circuits, Sep. 2000, pp. 1368-1382, vol. 35, No. 9.

International Search Report mailed Mar. 8, 2012 in re International application PCT/SE2011/051423.

* cited by examiner

IMBALANCE DETECTION AND REDUCTION FOR WIDEBAND BALUN

RELATED APPLICATIONS

The present application is a continuation of U.S. patent application Ser. No. 12/957,684, which was filed on Dec. 1, 2010, and is incorporated by reference herein in its entirety.

TECHNICAL FIELD

The present invention generally relates to baluns, and particularly relates to circuits and methods for detecting and reducing imbalance between differential signals generated by a balun.

BACKGROUND

Single-ended signaling approaches transmit information by sending a single-ended electrical signal over a single signal conductor. Differential signaling approaches, by contrast, transmit information by sending two complementary (i.e., differential) signals over two separate signal conductors. Single-ended signaling typically costs less, but lacks the noise rejection benefits of differential signaling. Consequently, both signaling approaches appear in common electrical circuits.

A balun converts single-ended signals to differential signals, and vice versa, and thereby enables circuits that use different signaling approaches to connect to one another (e.g., antennas and differential amplifiers). In one typical implementation of single-ended to differential signal conversion, a balun consists of a symmetric transformer that has a center tap in its secondary winding. When converting to differential signals, the transformer's primary winding receives the single-ended signal and the transformer's secondary winding generates the differential signals relative to a common reference signal present at the center tap.

Ideally, the differential signals generated by a balun are balanced in the sense that they have the same amplitudes, but opposite phases. In practice, however, achieving perfect balance between differential signals proves quite challenging, especially for a wide range of signal frequencies. Unavoidable asymmetry in the physical layout of an on-chip balun, for example, introduces imbalance between the amplitudes, phases, or both of differential signals. Process variation in the manufacture of on-chip balun components for semi-conductor chips also introduces imbalance. Further, parasitic cross-coupling capacitance between the primary winding and the second winding introduces imbalance when converting signals with high frequency.

Imbalanced differential signals significantly limit performance of wireless communication systems. As one example, the transmitter of a radio front-end employing frequency-division duplexing (FDD) sometimes produces a large amplitude leakage into the receiver. This transmit signal leakage in turn causes intermodulation distortions in the receiver, including for example second inter-modulation distortions known as IMD2. If the receiver directly down-converts the received radio signal to baseband, without first translating the received signal to an intermediate frequency, the second-order inter-modulation distortions disturb the baseband signal. The receiver can theoretically employ a balun to produce differential radio frequency signals and use differential circuits to cancel such even order distortions before they disturb the baseband signal. However, without well balanced differential signals the differential circuits cannot completely eliminate the distortions.

SUMMARY

Teachings herein advantageously detect and reduce imbalance between differential signals generated by a balun. The teachings thereby produce well balanced differential signals even when asymmetries or process variations in the balun would otherwise result in imbalance. Notably, the teachings also produce well balanced differential signals over a wide range of signal frequencies, and are thus well suited for improving the performance of wireless communication systems.

According to some embodiments, a circuit converts a single-ended signal to differential signals that are balanced to have the same amplitude and opposite phase. The circuit includes a balance tunable balun, a detector, and a controller. The balance tunable balun is "balance tunable" in the sense that its output balance (i.e., the balance between the differential signals output by the balun) is tunable. Specifically, the balance tunable balun comprises a balun with primary and secondary windings, and further comprises a control input and a switched resistor-capacitor (RC) network. The primary winding receives the single-ended signal and the secondary winding outputs the differential signals. The control input receives a control signal and the switched RC network tunes the output balance of the balance tunable balun responsive to that control signal. The detector detects the output imbalance and the controller outputs the control signal to control the switched RC network to reduce the output imbalance.

As the balance tunable balun is an inductive device, it can of course be tuned to resonate at any required frequency by some kind of frequency tuning circuit. Note, though, that such resonance frequency tuning is distinct from the balance tuning discussed herein. In the context of balance tuning, the balance tunable balun is tuned or calibrated over a wide range of signal (i.e., working) frequencies according to the control signal. At each desired working frequency, the control signal may have a different value in order to create balanced differential outputs at that specific frequency.

A switched RC network (SCRN) as used herein refers generally to any RC network that has switched inputs, switched RC components, or both. A switched RC network that has switched RC components, but a fixed input instead of switched inputs, may more specifically be referred to herein as a "tunable" RC network (TRCN).

In one or more embodiments, for example, the secondary winding has a center tap that is connected to a signal ground via a SRCN comprising a TRCN. The controller reduces output imbalance by tuning this TRCN via the control signal. More particularly, the controller generates the control signal to direct the TRCN to selectively connect one or more resistors, and one or more capacitors, between the center tap and the signal ground.

In other embodiments, the primary winding has a plurality of primary taps (m) surrounding a primary port connected to a signal ground. Also, the secondary winding has a center tap. The balance tunable balun includes an SRCN that selectively connects one of the primary winding's taps (as inputs to the SRCN) to the secondary winding's center tap via an RC network, responsive to the control signal. In some embodiments, this RC network remains fixed, such that the SRCN only includes a switched input. In other embodiments, the RC network may comprise a TRCN, such that the SRCN includes both a switched input and switched RC components.

Embodiments including either a TRCN or an SRCN reduce detected imbalance particularly well for imbalance attributable to balun asymmetry or process variation. However, for imbalance attributable to parasitic capacitance at high frequencies, embodiments that include both a TRCN (as a first SRCN) and an SRCN (as a second SRCN) offer enhanced imbalance reduction. By including both a TRCN and an SRCN, these embodiments provide both coarse and fine tuning of the output imbalance. The controller may, for example, control the SRCN for coarsely tuning the output imbalance and control the TRCN for finely tuning the output imbalance.

Alternative embodiments provide substantially equivalent imbalance reduction, even for imbalance attributable to parasitic capacitance. Specifically, the secondary winding's has a plurality of candidate center taps. These candidate center taps are each a "candidate" for being the electrical center of the secondary winding. The controller generates the control signal to selectively connect one of these candidate center taps, via an SRCN, to the signal ground. This SRCN may comprise only a switched input, or both a switched input and switched RC components.

Still other embodiments reduce imbalance without taking any taps from the primary winding, and without taking any taps from the secondary winding other than one center tap. In these embodiments, the controller reduces imbalance not only by controlling an SRCN connected to the secondary winding's center tap, but also by controlling one or more controllable capacitances introduced to the balun. For example, a controllable capacitance may be introduced between one of the secondary winding's secondary ports and the center tap. By controlling this controllable capacitance, in cooperation with controlling the SRCN the controller reduces output imbalance.

In one or more embodiments, the circuit described above may comprise part of a radio receiver, for improving the performance of a wireless communication system. In these embodiments, the circuit may operate solely on radio frequency signals, to simply reduce imbalance introduced by the balun. In other embodiments, though, the circuit may also operate on baseband signals, to reduce imbalance introduced by the balun as well as imbalance introduced by other receiver components (e.g., a mixer).

Of course, the present invention is not limited to the above features and advantages. Indeed, those skilled in the art will recognize additional features and advantages upon reading the following detailed description, and upon viewing the accompanying drawings.

DETAILED DESCRIPTION

Figure 1:
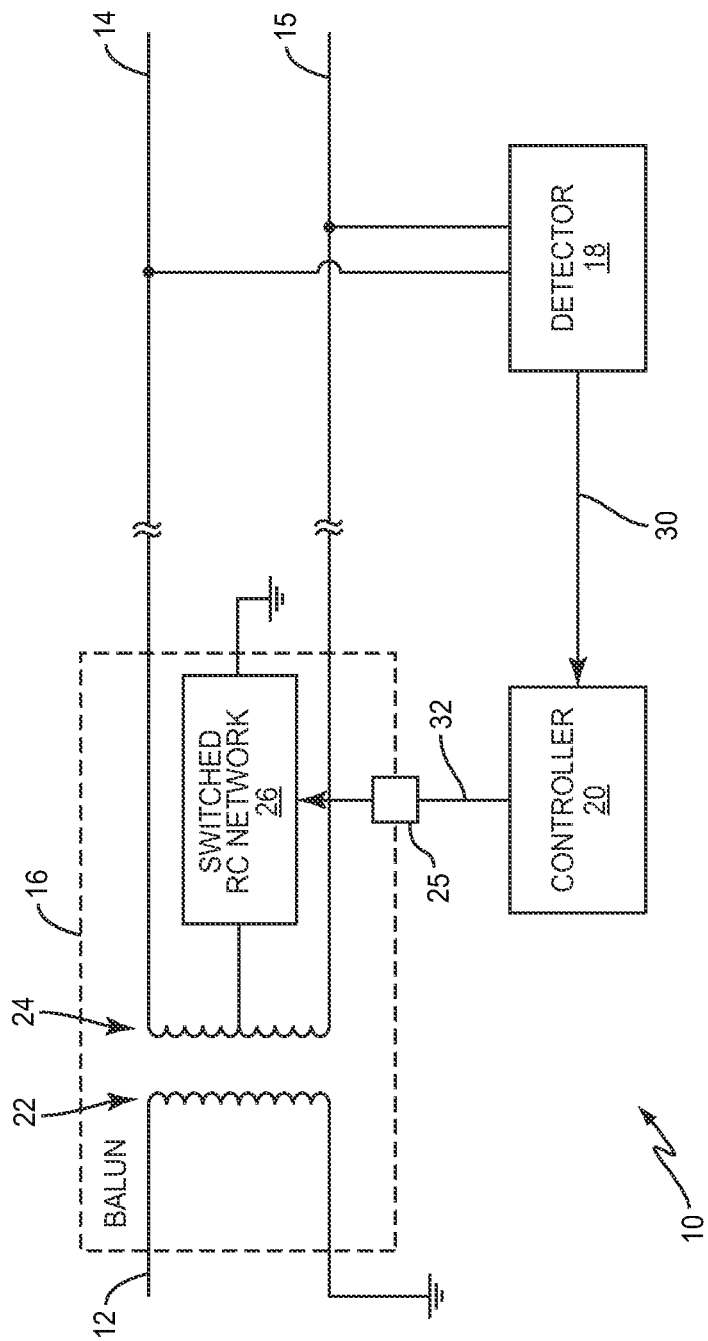
FIG. 1 is a block diagram of a circuit configured to convert a single-ended signal to differential signals, according to some embodiments of the present invention.

FIG. 1 illustrates a circuit 10 configured to convert a single-ended signal 12 to differential signals 14 and 15 that are balanced to have the same amplitudes and opposite phases. The circuit 10 includes a balance tunable balun 16, a detector 18, and a controller 20.

The balance tunable balun 16 has a primary winding 22, a secondary winding 24, a control input 25, and a switched resistor-capacitor (RC) network 26. The primary and secondary windings 22, 24 are magnetically coupled together. The primary winding 22 receives the single-ended signal 12 and the secondary winding 24 outputs the differential signals 14 and 15. The control input 25 receives a control signal 32, and the switched RC network 26 tunes an output imbalance of the balance tunable balun 16 responsive to this control signal 32. The output imbalance is an imbalance between the balance tunable balun's outputs; that is, an imbalance between the differential signals 14 and 15. The detector 18 detects this output imbalance and the controller 20 generates the control signal 32 to control the switched RC network 26 to reduce that output imbalance.

In some embodiments, for example, the detector 18 generates an error signal 30 that indicates the residual error of the output imbalance between the differential signals 14 and 15. Responsive to this error signal 30, the controller 20 generates an control signal 32 that controls the switched RC network 26 as needed to reduce the residual error of the output imbalance indicated by the error signal 30, e.g., to below some predetermined acceptable imbalance threshold. In some embodiments, the controller 20 generates the control signal 32 as a multi-bit control signal. In this case, the control input 25 comprises a binary vector input that receives the multi-bit control signal 32.

Figure 2A:
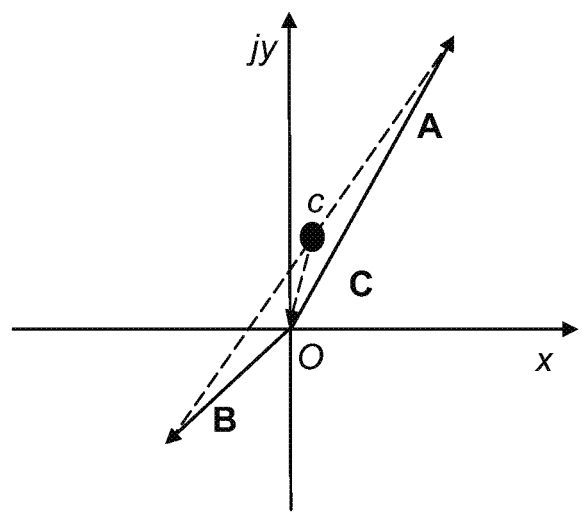
FIGS. 2A-2B are graphs illustrating exemplary control of a balance tunable balun for reducing imbalance detected between the differential signals.
Figure 2B:
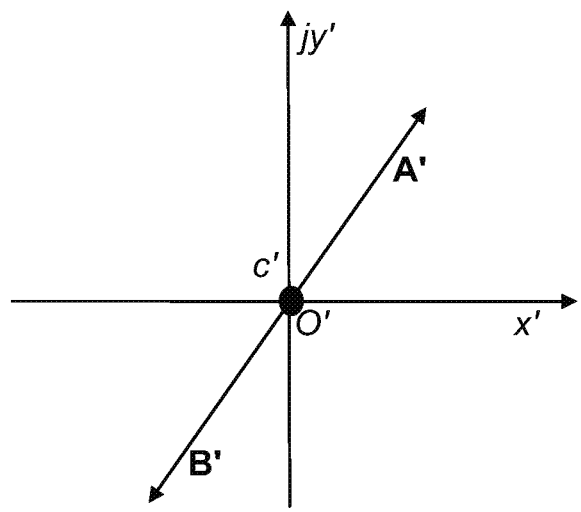

Regardless of the particular type of the control signal 32, the controller's generation of that control signal 32 and corresponding control of the switched RC network 26 affects the balance between the differential signals 14 and 15. This is because the control signal 32 effectively adjusts a reference point of the differential signals 14 and 15. The graphical example in FIGS. 2A-2B illustrates this concept well. In FIG. 2A, the origin O in the complex coordinate system (x, jy) defines the reference point of the differential signals. Typically, this reference point is signal ground. Each differential signal 14 and 15, represented by respective vectors A and B, has an amplitude and phase defined relative to this origin O.

When the reference point is defined at the origin O as shown, the differential signals 14 and 15 are imbalanced because the vectors A and B do not have exactly the same amplitudes or exactly opposite phases relative to the origin O.

The detector 18 described above detects this imbalance and the controller 20 reduces the imbalance by controlling the switched RC network 26. Specifically, in controlling the switched RC network 26, the controller 20 effectively creates an offset. As a result, the output differential signal 14 and 15 becomes balanced. This equivalently translates the complex coordinate system (x, jy) with origin O into a new complex coordinate system (x', jy') with new origin O'. The controller 20 thereby adjusts the reference point of the differential signals 14 and 15 so that, in this new complex coordinate system (x', jy'), the differential signals 14 and 15 are better balanced (i.e., so that the vectors A and B, when translated into A' and B' in the new complex coordinate system (x', jy'), more closely approximate vectors that have the same amplitudes and opposite phase relative to the new origin O').

FIGS. 2A-2B illustrate a simple, ideal case where the controller 20 perfectly balances the differential signals. The controller 20 adjusts the reference point of the differential signals 14 and 15 by a vector C. This translates point c in the complex coordinate system (x, jy) to the origin O' in the new complex coordinate system (x', jy'), and correspondingly translates the vectors A and B in the complex coordinate system (x, jy) to the vectors A' and B' shown in FIG. 2B. These vectors A' and B' have exactly the same amplitudes and exactly opposites relative to the new origin O'.

As explained in more detail below, a switched RC network (SCRN) 26 as used herein refers generally to any RC network that has switched inputs, switched RC components, or both. A switched RC network 26 that has switched RC components, but a fixed input instead of switched inputs, may more specifically be referred to herein as a "tunable" RC network (TRCN).

Figure 3:
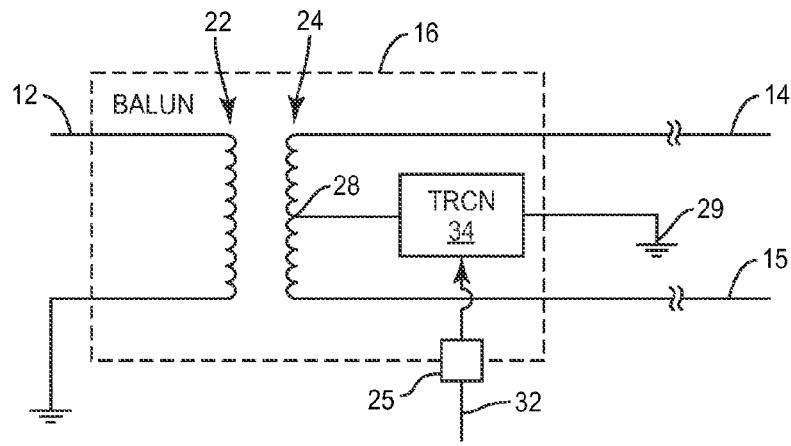
FIG. 3 is a block diagram of a balance tunable balun that includes a switched resistor-capacitor network according to one embodiment.
Figure 4:
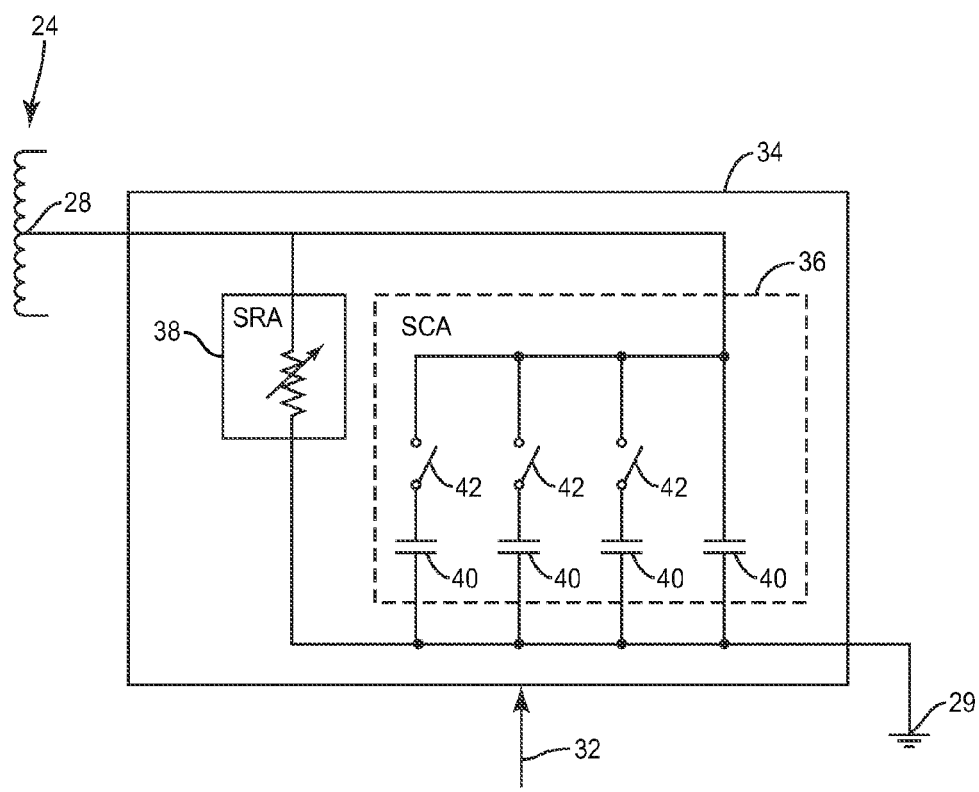
FIG. 4 is a block diagram of a switched resistor-capacitor network that comprises a tunable resistor-capacitor network (TRCN) according to one or more embodiments.

FIG. 3 illustrates an embodiment where the switched RC network 26 comprises a TRCN 34 (shown here as a two-port TRCN). The secondary winding 24 in these embodiments has a center tap 28 that is connected to a signal ground 29 via the tunable RC network 34. The controller 20 reduces imbalance by tuning this tunable RC network 34 via the control signal 32. More particularly, the controller 20 tunes the tunable RC network 34 to have any impedance R±jσ, where R represents any one of a plurality of discrete resistances with which the network 34 is pre-configured and σ represents any one of a plurality of discrete reactances with which the network 34 is pre-configured. In one or more embodiments, for example, the tunable RC network 34 includes switched resistor and capacitor arrays that are pre-configured with particular resistors and capacitors, respectively. FIG. 4 shows an example of these embodiments.

In FIG. 4, as an example, the two-port tunable RC network 34 comprises a switched capacitor array (SCA) 36 and a switched resistor array (SRA) 38. The switched capacitor array 36 includes a plurality of capacitors 40 and is configured to selectively connect one or more of these capacitors 40 to the center tap 28 responsive to the control signal 32. The switched capacitor array 36, for example, includes a plurality of switches 42 that each selectively connect a corresponding one of the capacitors 40 to the center tap 28 in accordance with the control signal 32. Optionally, a varactor capacitor can also be used in parallel with the selectively connected capacitors.

Similarly, the switched resistor array 38 includes a plurality of resistors and is configured to selectively connect one or more of those resistors to the center tap 28 responsive to the control signal 32. For ease of illustration, details of the switched resistor array 38 have been omitted from FIG. 4, but the array 38 may be implemented in much the same way as the switched capacitor array 36 with resistors in place of the capacitors 40.

Figure 5:
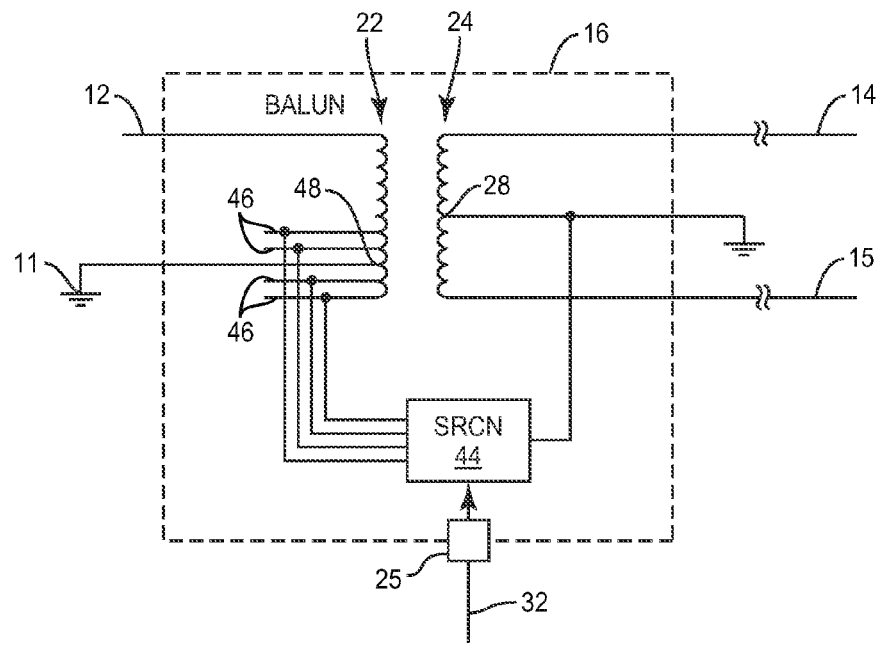
FIG. 5 is a block diagram of a balance tunable balun that includes a switched resistor-capacitor network (SRCN) according to another embodiment.

FIG. 5 illustrates other embodiments of the balance tunable balun 16 that include a switched RC network in a more general sense. In these embodiments, the primary winding 22 has a plurality of primary taps 46 surrounding a primary port 48 connected to a signal ground 11. The balance tunable balun 16 comprises a switched RC network (SRCN) 44 that selectively connects one of these primary taps 46 (as inputs to the SRCN 44) to a center tap 28 of the secondary winding 24 via an RC network (not shown), responsive to the control signal 32. In embodiments where the primary winding 22 has m taps 46 surrounding the primary port 48, for example, the SRCN 44 may comprise an m-to-1 switch that switches the input of the SCRN 44 between different ones of those m taps 46. The tap selected by the m-to-1 switch is applied to an RC network. In some embodiments, the RC network remains fixed, such that the SRCN 44 connects a primary tap to the center tap 28 via the same RC components regardless of the control signal 32 and regardless of which primary tap 46 is selected; that is, the SRCN 44 only includes a switched input. In other embodiments, the RC network inside the SRCN 44 may comprise a TRCN similar to that illustrated in FIG. 4, such that the control signal 32 not only selects between different primary taps 46, but also tunes the TRCN; that is, the SRCN 44 includes both a switched input and switched RC components.

The balun embodiments illustrated in FIGS. 3-5 reduce imbalance particularly well for imbalance attributable to balun asymmetry or process variation. However, for imbalance attributable to parasitic capacitance at high frequencies, embodiments illustrated in FIG. 6 offer enhanced imbalance reduction. The balance tunable balun 16 in FIG. 6 embodiments includes both a TRCN 34 (as a first SRCN) and a SRCN 44 (as a second SRCN) in order to provide coarse and fine tuning of the output imbalance. In one embodiment, for example, the controller 20 controls the SRCN 44 for coarsely tuning the output imbalance. The controller 20 may, for example, control the SRCN's selection of different primary taps 46 for making coarse center tap impedance adjustments. In this case, the controller 20 controls the TRCN 34 for finely tuning the output imbalance. In other embodiments, the roles of the TRCN 34 and the SRCN 44 may be switched, providing coarse tuning via the TRCN 34 and fine tuning via the SRCN 44.

Figure 6:
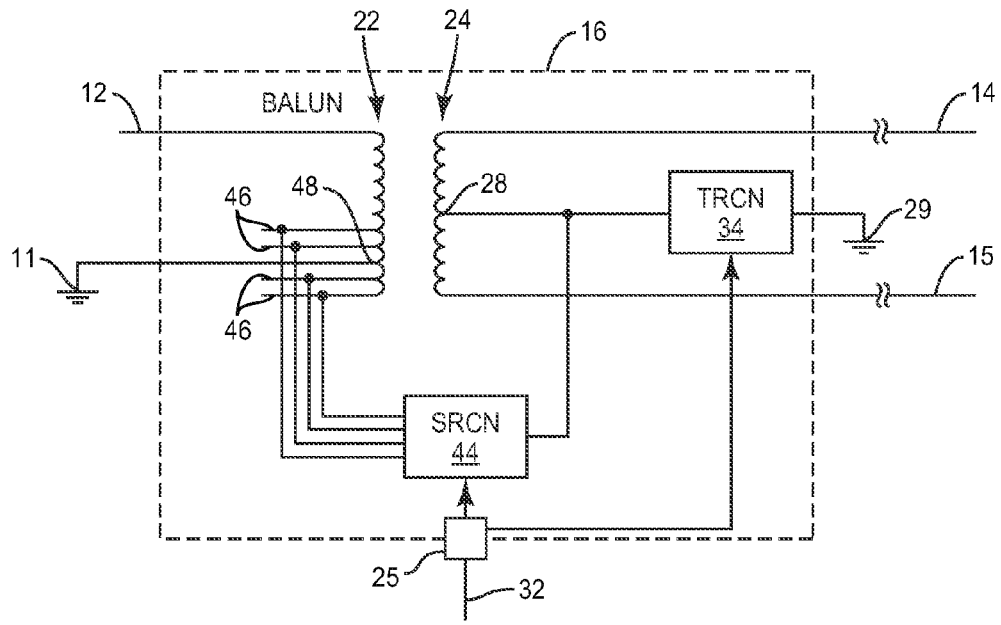
FIG. 6 is a block diagram of a balance tunable balun that includes both a TRCN and a SRCN according to one or more embodiments.
Figure 7:
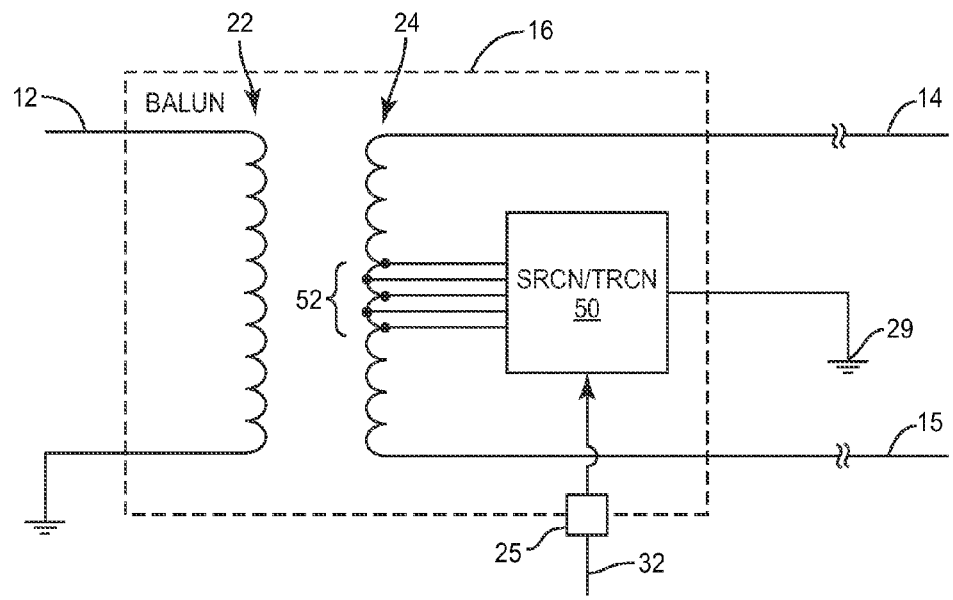
FIG. 7 is a block diagram of a balance tunable balun that includes a SRCN according to one or more embodiments.

FIG. 7 illustrates alternative balance tunable balun 16 embodiments to FIG. 6 that provide substantially equivalent imbalance reduction, even for imbalance attributable to parasitic capacitance. Rather than tapping the primary winding 22, the embodiments tap the secondary winding 24 with a SRCN 50 to a signal ground 29. Specifically, the secondary winding 24 in these embodiments comprises one of a plurality of so-called candidate center taps 52 that surround the geometric center of the secondary winding 24. These candidate center taps 52 are each a "candidate" for being the electrical center of the secondary winding 24. The controller 20 generates the control signal 32 to selectively connect one of these candidate center taps 52, via the SRCN 50, to the signal ground 29. Similar to the SRCN 44 in FIG. 6, the SRCN 50 may comprise only a switched input, or both a switched input and switched RC components.

FIG. 7 shows five candidate center taps 52, but other embodiments may include any number of candidate center taps 52 greater than one. A greater number of candidate center taps 52 provides a better approximation to the secondary winding's electrical center over a greater range of operating scenarios, e.g., over a greater range of frequencies. Taking at least some candidate center taps 52 at locations other than the beginning or end of turns (i.e., at fractions of a turn) may also provide better approximations.

Other alternative embodiments reduce imbalance without taking any taps from the primary winding 22, and without taking any taps from the secondary winding 24 other than the one center tap 28 consistently illustrated in FIGS. 1-7. In these embodiments, the controller 20 reduces imbalance not only by controlling the reference point of the differential signals 14 and 15, but also by controlling the amplitude of one of the differential signals 14 and 15. Consider again the simple example illustrated back in FIGS. 2A-2B. In that example, the differential signal 14 and 15 represented by the vector A had a greater amplitude than the differential signal 14 and 15 represented by the vector B. The controller 20 thus reduces imbalance by reducing the amplitude of the vector A differential signal 14 and 15, in cooperation with adjusting the reference point (i.e., the origin O) of the differential signals 14 and 15.

Figure 8:
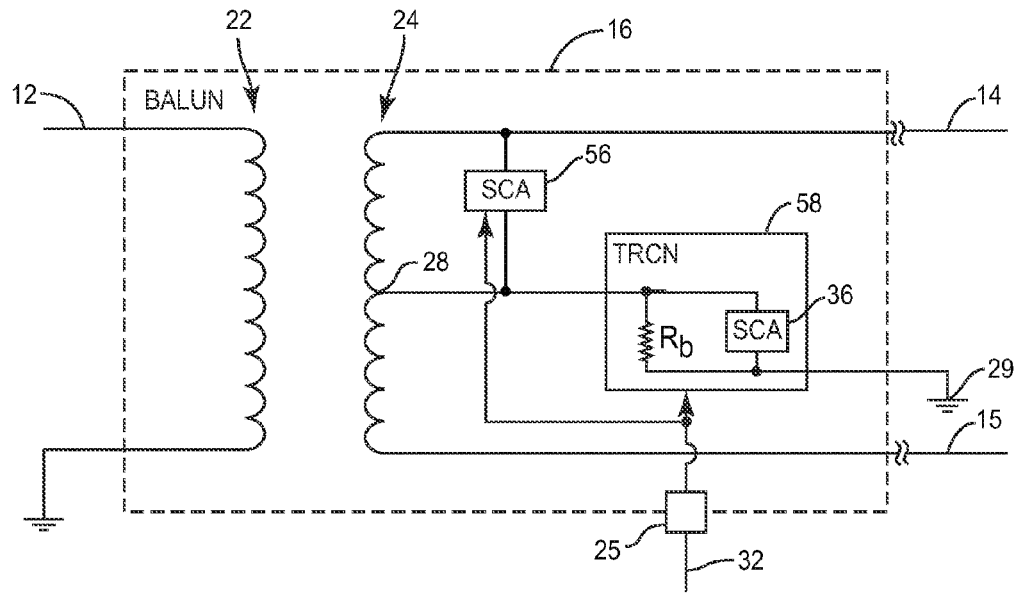
FIG. 8 is a block diagram of a balance tunable balun that includes a controllable capacitance connected from one output port to the center tap, according to one or more embodiments.

FIG. 8 illustrates one such embodiment of a balance tunable balun 16. In FIG. 8, similar to FIG. 3, the balance tunable balun 16 includes an SRCN that comprises a TRCN 58. The balance tunable balun 16, however, also includes a controllable capacitance connected from a secondary port 54 of the secondary winding 24 to the center tap 28. As shown, for example, the balance tunable balun 16 includes an SCA 56 connected from the secondary port 54 to the center tap 28. Regardless, the secondary winding 24 outputs one of the differential signals 14 and 15 at secondary port 54; this differential signal 14 or 15 has an amplitude that depends on the capacitance of the SCA 56. The controller 20 thereby reduces output imbalance by controlling the SCA 56 (to adjust the amplitude of one differential signal 14 or 15) and the TRCN 58 (to adjust the reference point of the differential signals 14 and 15).

Although the controller 20 in some embodiments tunes the output imbalance by controlling a TRCN 34 like the one shown in FIG. 4, the controller 20 in other embodiments controls the TRCN 58 shown in FIG. 8. The TRCN 58 in FIG. 8 includes the same SCA 36 as the TRCN 34 in FIG. 4, but does not include the SRA 38. Instead of the SRA 38, which selectively connected any one of a plurality of resistors to the center tap 28 responsive to the control signal 32, the TRCN 58 includes a single bias resistor $R_b$ that remains statically connected to the center tap 28 irrespective of the control signal 32. The single bias resistor $R_b$ reduces the complexity of the TRCN 58 in FIG. 8 as compared to the TRCN 34 in FIG. 4 with little or no degradation to the circuit's imbalance reduction performance.

Figure 9:
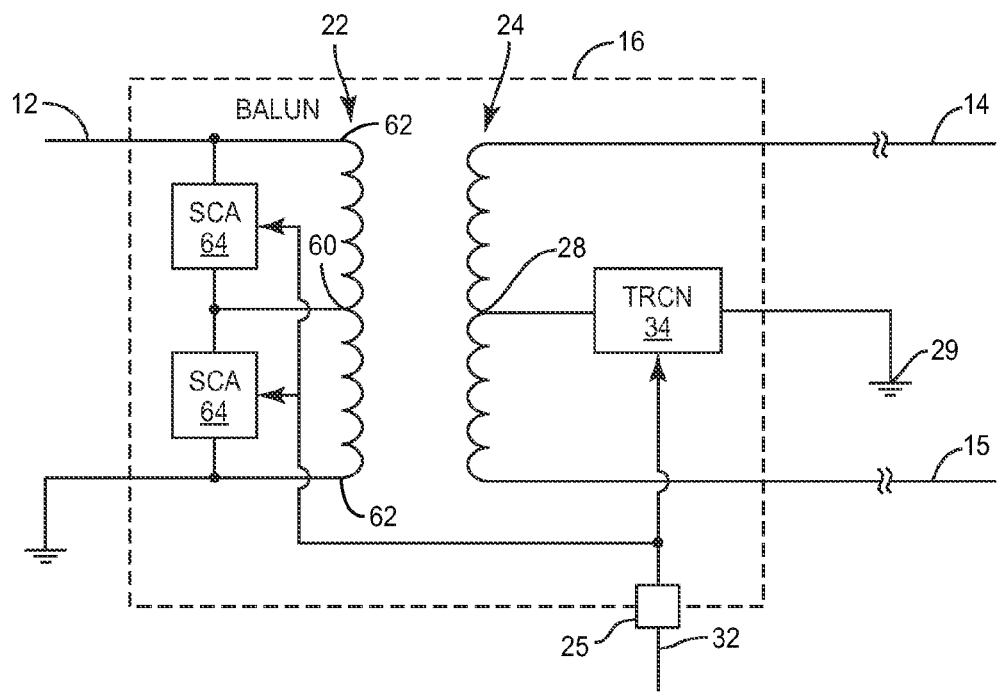
FIG. 9 is a block diagram of a balance tunable balun that includes two controllable capacitances connected from respective primary ports to the primary winding's center tap, according to various embodiments.

FIG. 9 illustrates an alternative balance tunable balun 16 embodiment to FIG. 8 that provides substantially equivalent imbalance reduction. Like the embodiment in FIG. 8, the embodiment in FIG. 9 reduces imbalance by controlling the reference point of the differential signals 14 and 15, as well as controlling the amplitude of one of the differential signals 14 or 15. However, rather than controlling the amplitude of one of the differential signals 14 and 15 by controlling the controllable capacitance of a secondary port, the embodiment in FIG. 9 controls controllable capacitances of primary ports.

More particularly, the primary winding 22 in FIG. 9 has a center tap 60 and two primary ports 62. Again, similar to FIG. 3, the balance tunable balun 16 includes an SRCN that comprises a TRCN 58. The balance tunable balun 16 further comprises two controllable capacitances connected from each respective port 62 to the primary winding's center tap 60. As shown, for example, the balance tunable balun 16 includes SCAs 64 connected from each primary port 62 to center tap 60. Regardless, one of the differential signals 14 and 15 has an amplitude that depends on the capacitances of the SCAs 64. The controller 20 thereby reduces output imbalance by controlling the SCAs 64 (to adjust the amplitude of one differential signal 14 or 15) and the TRCN 34 (to adjust the reference point of the differential signals 14 and 15).

Figure 10A:
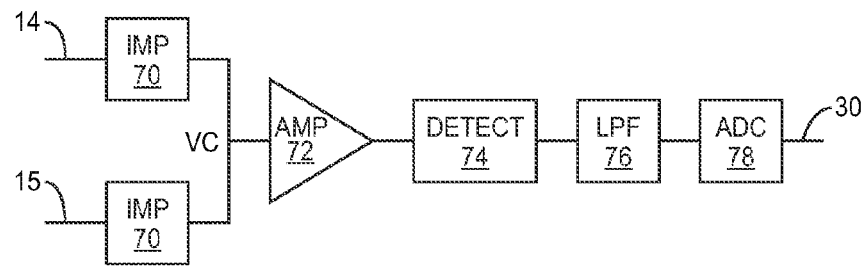
FIGS. 10A-10C are block diagrams of alternative embodiments of a detector.
Figure 10B:
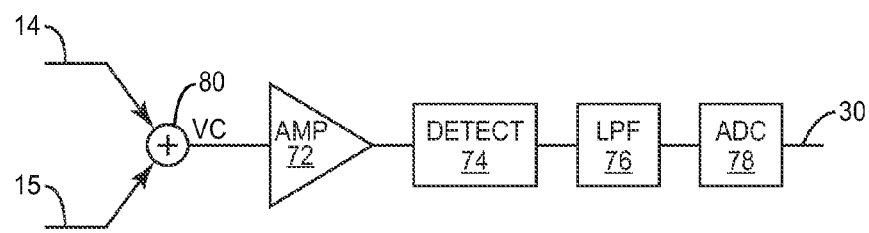
Figure 10C:
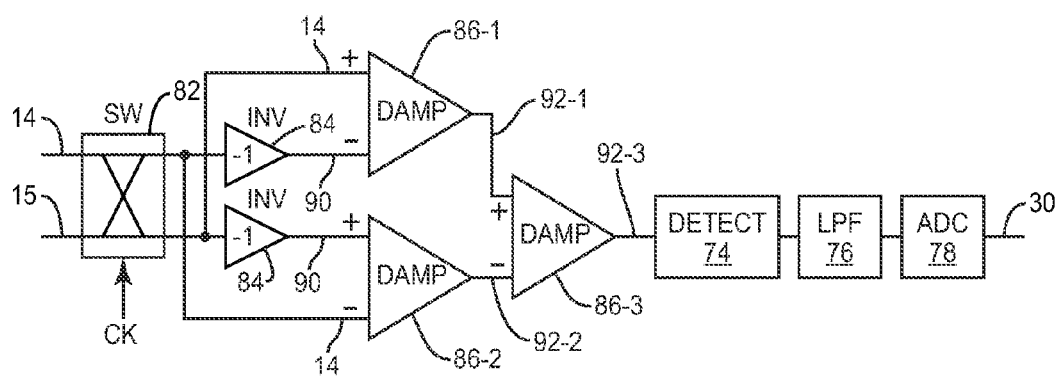

FIGS. 10A-10C illustrate various embodiments of the detector 18 for detecting imbalance between the differential signals 14 and 15. In FIG. 10A, the detector 18 includes two impedances 70, an amplifier 72, a detector 74, a low pass filter (LPF) 76, and an analog-to-digital converter (ADC) 78. The two impedances 70 (e.g., resistors) connect at one end to respective differential signals 14 and 15 and join at the other end to generate a voltage vc. The impedances 70 generate a voltage vc of approximately 0 V if the differential signals 14 and 15 are balanced with the same amplitudes but opposite phases. However, the impedances 70 generate a voltage vc greater than 0 V if the differential signals 14 and 15 are imbalanced; the greater the voltage vc, the greater the residual error of the imbalance. The amplifier 72, detector 74, LPF 76, and ADC 78 amplify, detect, filter, and convert this voltage vc into a digital error signal 30 that indicates the residual error of the imbalance between the differential signals. The detector 74 may comprise an amplitude detector, a power detector, an envelope detector, or the like for detecting the amplified voltage vc. Also, as shown in FIG. 10B, the impedances 70 may be replaced by an adder 80 to equivalently generate voltage vc.

In FIG. 10C, the detector 18 still includes detector 74, LPF 76, and ADC 78. Instead of impedances 70 or adder 80, and instead of amplifier 72, the detector 18 includes a switch 82, two inverters 84, and three differential amplifiers 86-1, 86-2, and 86-3. The switch 82 includes two input ports and two output ports. The input ports receive respective ones of the differential signals 14 and 15. The output ports each output one of those differential signals 14 and 15 unchanged. Which particular differential signal 14 and 15 a particular output port outputs, though, varies periodically in accordance with a clock signal Ck. Thus, the switch 82 periodically swaps the differential signals 14 and 15 with respect to its output ports. In doing so, the switch 82 eliminates any possible error in detecting imbalance that might be attributable to mismatch between other components in the detector 74, such as the pair of inventers 84.

Each inverter 84 inverts the differential signal 14 output by a respective output port of the switch 82. In doing so, each inverter 84 effectively generates an inverted version 90 of that differential signal 14 and 15 that has the same amplitude, but opposite phase.

During any given clock period, differential amplifier 86-1 amplifies the difference between a first differential signal 14 and 15 and the inverted version 90 of a second differential signal 14 and 15, and thereby generates a first amplified difference signal 92-1. Conversely, differential amplifier 86-2 amplifies the difference between the second differential signal 14 and 15 and the inverted version 90 of the first differential signal 14 and 15, and thereby generates a second amplified difference signal 92-2. Differential amplifier 86-3 amplifies the difference between this second amplified difference signal 92-2 and the first amplified difference signal 92-2, to thereby generate a third amplified difference signal 92-3. The detector 74, LPF 76, and ADC 78 detect, filter, and convert this third amplified difference signal 92-3 into a digital error signal 30 that indicates the residual error of the imbalance between the differential signals 14 and 15.

During the next clock period, the switch swaps the differential signals 14 and 15 with respect to the switch's output ports, which correspondingly swaps the roles of differential amplifiers 86-1 and 86-2. Again, this swap eliminates any possible error in detecting imbalance that might be attributable to mismatch between the inverters 84, or between the differential amplifiers 86-1 and 86-2.

Regardless of the particular manner in which the detector 18 generates the error signal 30, the controller 20 evaluates that error signal 30 and dynamically controls the SRCN 26 as needed to reduce the residual error of the imbalance indicated by the error signal 30. In some embodiments, the controller 20 controls the SRCN 26 over several control periods, controlling the SRCN 26 in any given control period based on an evaluation of whether control of the SRCN 26 in a previous control period increased or decreased the residual error of imbalance. For example, if the controller 20 controlled the SRCN 26 to increase the center tap impedance in a previous control period by increasing resistance, and that increase in resistance actually increased imbalance, the controller 20 may decrease resistance in subsequent control periods in order to decrease the imbalance.

Figure 11A:
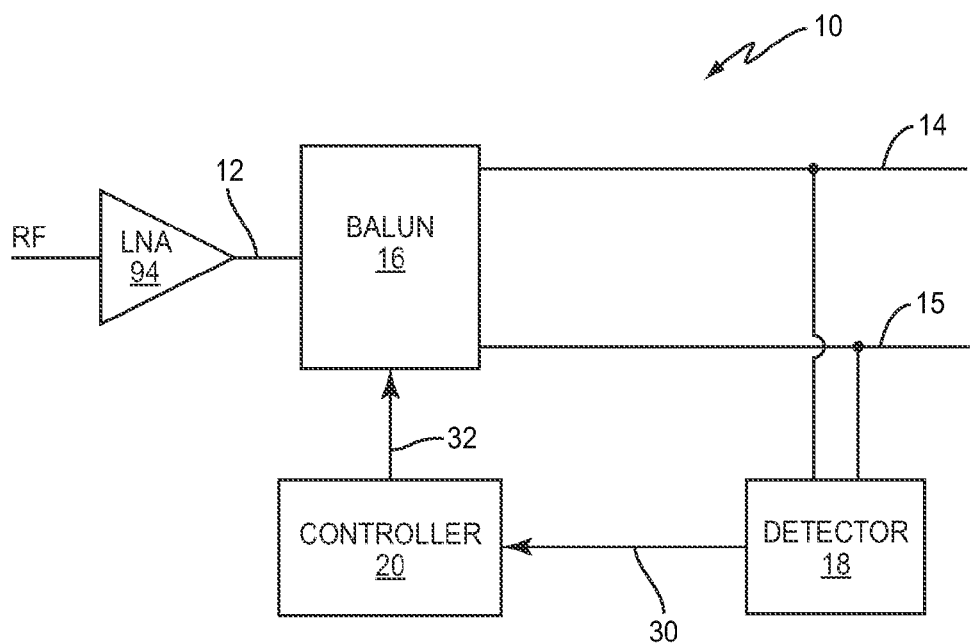
FIGS. 11A-11C are block diagrams of alternative embodiments of a circuit that comprises part of a radio receiver.

As imbalance significantly limits performance of wireless communication systems, the circuit 10 described above advantageously comprises part of a radio receiver in one or more embodiments. Consider first the embodiment shown in FIG. 11A. In FIG. 11A, a low-noise amplifier (LNA) 94 amplifies a radio frequency (RF) signal received by one or more antennas associated with the radio receiver, in order to generate the single-ended signal 12. The single-ended signal 12 thus comprises a radio frequency (RF) signal. The balance tunable balun 16 converts this single-ended signal 12 into differential radio frequency signals 14 and 15. The detector 18 detects imbalance between the differential radio frequency signals 14 and 15, and the controller reduces the detected imbalance by dynamically controlling the SRCN 26.

Although the embodiment in FIG. 11A certainly reduces imbalance introduced by the balun 16, the radio receiver may include other components that also introduce imbalance. The circuit 10 in other embodiments advantageously reduces imbalance introduced by these other receiver components as well. Consider the embodiment shown in FIG. 11B.

Figure 11B:
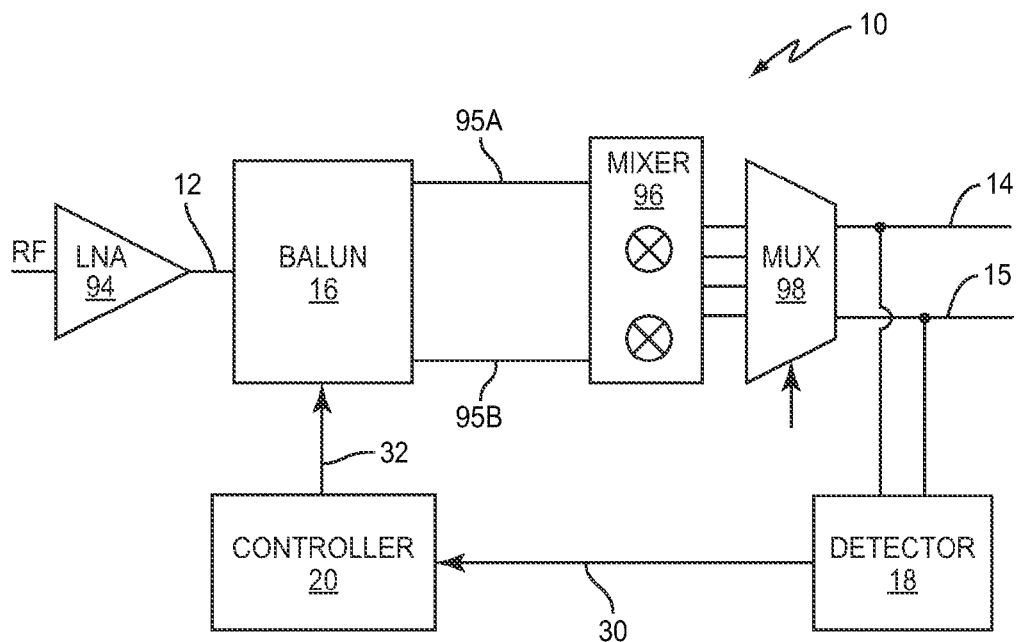

In FIG. 11B, the circuit 10 reduces imbalance introduced by the balun 16, as well as imbalance introduced by a mixer 96 included in the radio receiver chain. More particularly, the balance tunable balun 16 converts the single-ended signal 12 into differential radio frequency signals 95A and 95B. These differential radio frequency signals 95A and 95B may be imbalanced, but unlike the embodiment in FIG. 11A the detector 18 does not detect that imbalance. Instead, the mixer 96 (in cooperation with multiplexer 98) first converts these differential radio frequency signals 95A and 95B into differential baseband signals 14 and 15, and the detector 18 detects imbalance between those differential baseband signals 14 and 15. Responsive to imbalance between the differential baseband signals 14 and 15 rather than the differential radio frequency signals 95A and 95B, the circuit 10 reduces imbalance introduced by both the balun 16 and the mixer 96.

Figure 11C:
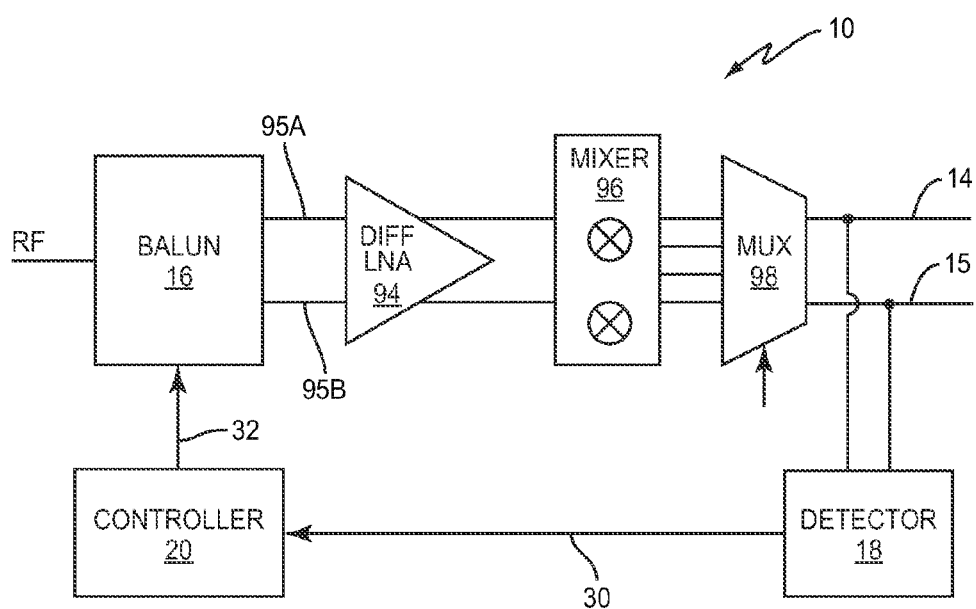

Those skilled in the art will of course appreciate that the above embodiments represent non-limiting examples of the present invention. As one example, FIG. 11B illustrates the LNA 94 as converting the received RF signal into the single-ended signal 12 before that signal 12 is input into the balance tunable balun 16. In other embodiments, like the one shown in FIG. 11C, the received RF signal may be input into the balance tunable balun 16 directly, such that the balance tunable balun 16 converts the received RF signal into differential RF signals 95A and 95B. In these embodiments, differential LNA 94 amplifies the differential RF signals 95A and 95B before they are input into the mixer 96. The differential baseband signals 14 and 15 at the output of the multiplexer MUX 98 are selected from the quadrature different outputs of mixer 96 by setting a control bit input to the MUX 98. Thus, in this case, the feedback loop includes the balance tunable balun 16, differential LNA 94, mixer 96, detector 18, and controller 20. Any imbalance in the signal path from RF input to mixer outputs, due to process variation or design asymmetry, can be compensated by adjusting the balance tunable balun 16, the balance control of the mixer 96, or most likely in practice both. Any or all of these adjustments may be facilitated through control signal 32. The balance control of the mixer 96 can be done in many ways, such as by adjusting the LO clock output level, mixer conversion gain, etc, so that the even order distortions, like IM2, are minimized.

As another example, the above description may have been simplified in a number of respects for explanatory purposes. Indeed, the description above may have conveniently omitted one or more balun components that, while present in many known balun implementations, do not affect imbalance between the differential signals 14 and 15. Voltage sources for imposing a DC bias to the balance tunable balun 16, for instance, do not affect imbalance and have been omitted.

Figure 12:
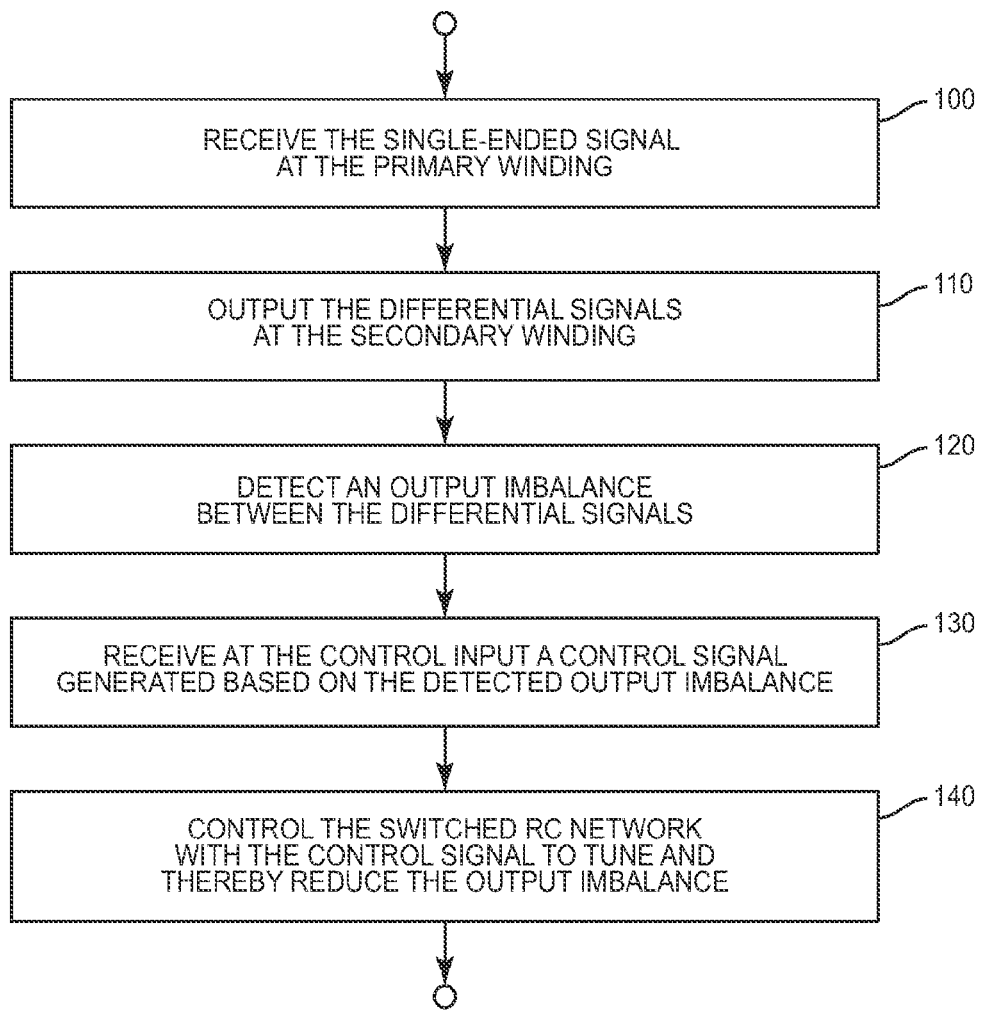
FIG. 12 is a logical flow diagram of a method for converting a single-ended signal to differential signals, according to some embodiments of the present invention.

In view of the above modifications and variations, those skilled in the art will appreciate that the circuit 10 generally performs the processing illustrated in FIG. 12 for converting a single-ended signal 12 to differential signals 14 and 15 that are balanced to have the same amplitudes and opposite phases. In FIG. 12, processing includes receiving the single-ended signal 12 at the primary winding 22 of the balance tunable balun 16 (Block 100). Processing further includes outputting the differential signals 14 and 15 at the secondary winding 24 (Block 110). Processing also includes detecting an output imbalance between the differential signals 14 and 15 (Block 120) and receiving at the control input 25 a control signal 32 generated based on that detected output imbalance (Block 130). Processing finally includes controlling the switched RC network 26 with the control signal 32 to tune and thereby reduce the output imbalance (Block 140).

Those skilled in the art will further appreciate that the various "circuits" described may refer to a combination of analog and digital circuits, and/or one or more processors configured with software stored in memory and/or firmware stored in memory that, when executed by the one or more processors, perform as described above. One or more of these processors, as well as the other digital hardware, may be included in a single application-specific integrated circuit (ASIC), or several processors and various digital hardware may be distributed among several separate components, whether individually packaged or assembled into a system-on-a-chip (SoC).

Thus, those skilled in the art will recognize that the present invention may be carried out in other ways than those specifically set forth herein without departing from essential characteristics of the invention. The present embodiments are thus to be considered in all respects as illustrative and not restrictive, and all changes coming within the meaning and equivalency range of the appended claims are intended to be embraced therein.

What is claimed is:

1. A circuit configured to convert a single-ended signal to differential signals that are balanced to have the same amplitudes and opposite phases relative to a reference point of the differential signals, the circuit comprising:

a balance tunable balun comprising:
  a primary winding configured to receive the single-ended signal;
  a secondary winding configured to output the differential signals;
  a control input configured to receive a control signal;
  a switched resistor-capacitor (RC) network configured to effectively control the reference point of the differential signals responsive to the control signal;
  a detector configured to detect an output imbalance of the balance tunable balun, the output imbalance comprising an imbalance between the differential signals; and
  a controller configured to generate the control signal to control the switched RC network to effectively adjust the reference point of the differential signals as needed to reduce the output imbalance detected by the detector.

2. The circuit of claim 1, wherein the switched RC network comprises a tunable RC network, and wherein the secondary winding has a center tap that is connected to a signal ground via the tunable RC network.

3. The circuit of claim 2, wherein the tunable RC network comprises:
  a switched capacitor array comprising a plurality of capacitors and configured to selectively connect one or more of the capacitors to the center tap responsive to the control signal; and
  a switched resistor array comprising a plurality of resistors and configured to selectively connect one or more of the resistors to the center tap responsive to the control signal.

4. The circuit of claim 2, wherein the primary winding has a primary port connected to a signal ground and a plurality of primary taps surrounding that primary port, wherein the balance tunable balun further comprises a second switched RC network also configured to tune the output imbalance responsive to the control signal, wherein the controller is configured to generate the control signal to selectively connect one of the primary taps to the center tap of the secondary winding, via the second switched RC network, and wherein the controller is configured to control one of the tunable RC network and the second switched RC network for coarsely tuning the output imbalance, and to control the other one of the tunable RC network and the second switched RC network for finely tuning the output imbalance.

5. The circuit of claim 2, wherein the balance tunable balun further comprises a controllable capacitance connected from one port of the secondary winding to the center tap and is configured to output one of the differential signals at that port, and wherein the controller is configured to reduce the output imbalance also by controlling said controllable capacitance.

6. The circuit of claim 5, wherein the controllable capacitance comprises a switched capacitor array comprising a plurality of capacitors and configured to selectively connect one or more of the capacitors from said one port to the center tap responsive to the control signal, and the balance tunable balun further includes a bias resistor statically connected to the center tap irrespective of the control signal.

7. The circuit of claim 2, wherein the balance tunable balun further comprises two controllable capacitances connected from each port of the primary winding to the primary winding's center tap, and wherein the controller is configured to reduce the output imbalance also by controlling said controllable capacitances.

8. The circuit of claim 1, wherein the primary winding has a primary port connected to ground and a plurality of primary taps surrounding that primary port, wherein the secondary winding has a center tap, and wherein the controller is configured to generate the control signal to selectively connect one of the primary taps to the center tap of the secondary winding, via the switched RC network.

9. The circuit of claim 1, wherein the secondary winding has a plurality of candidate center taps surrounding the geometric center of the secondary winding, and wherein the controller is configured to generate the control signal to selectively connect one of the candidate center taps, via the switched RC network, to a signal ground.

10. The circuit of claim 1, wherein the control input comprises a binary vector input and the control signal comprises a multi-bit control signal.

11. The circuit of claim 1, wherein the circuit is included in a radio receiver, wherein the single-ended signal comprises a radio frequency signal, and wherein the differential signals comprise radio frequency signals.

12. The circuit of claim 1 wherein the circuit comprises part of a radio receiver, wherein the single-ended signal comprises a radio frequency signal, wherein the secondary winding is configured to generate differential radio frequency signals, wherein the circuit further includes a mixer configured to convert the differential radio frequency signals into differential baseband signals, wherein the detector is configured to detect output imbalance between the differential baseband signals, and wherein the controller is configured to generate the control signal to control the switched RC network to reduce the output imbalance between the differential baseband signals.

13. A method in a circuit for converting a single-ended signal to differential signals that are balanced to have the same amplitudes and opposite phases relative to a reference point of the differential signals, the circuit including a balance tunable balun that comprises a primary winding, a secondary winding, a control input, and a switched resistor-capacitor (RC) network, the method comprising:
  receiving the single-ended signal at the primary winding;
  outputting the differential signals at the secondary winding;
  detecting an output imbalance between the differential signals, the output imbalance comprising an imbalance between the differential signals;
  receiving at the control input a control signal generated based on the detected output imbalance; and
  controlling the switched RC network with the control signal as needed to effectively adjust the reference point of the differential signals to reduce the detected output imbalance.

14. The method of claim 13, wherein controlling the switched RC network comprises tuning a tunable resistor-capacitor (RC) network, and wherein the secondary winding has a center tap that is connected to a signal ground via the tunable RC network.

15. The method of claim 14, wherein the tunable RC network comprises a plurality of capacitors and a plurality of resistors, and wherein tuning the tunable RC network comprises directing the tunable RC network to selectively connect one or more of the capacitors to the center tap, selectively connect one or more of the resistors to the center tap, or both.

16. The method of claim 14, wherein the primary winding has a primary port connected to ground and a plurality of primary taps surrounding that primary port, wherein the balance tunable balun includes a second switched RC network, wherein the method further comprises controlling the second switched RC network to also tune the output imbalance responsive to the control signal by selectively connecting one of the primary taps to the center tap, via the second switched RC network, and wherein controlling one of the tunable RC network and the second switched RC network coarsely tunes the output imbalance, and controlling the other one of the tunable RC network and the second switched RC network finely tunes the output imbalance.

17. The method of claim 14, wherein the balance tunable balun further comprises a controllable capacitance connected from one port of the secondary winding to the center tap wherein outputting the differential signals comprises outputting one of the differential signals at said port, and wherein the method further comprises controlling said controllable capacitance to also tune the output imbalance.

18. The method of claim 17, wherein a bias resistor is statically connected to the center tap, and wherein tuning the tunable RC network comprises controlling a switched capacitor array that is configured selectively connect one or more capacitors to the center tap.

19. The method of claim 14, wherein the balance tunable balun further comprises two controllable capacitances connected from each port of the primary winding to the primary winding's center tap, and wherein the method further comprises controlling said controllable capacitance to also tune the output imbalance.

20. The method of claim 13, wherein the primary winding has a primary port connected to ground and a plurality of primary taps surrounding that primary port, wherein the secondary winding has a center tap, and wherein controlling the switched RC network comprises selectively connecting one of the primary taps to the center tap via the switched RC network.

21. The method of claim 13, wherein the secondary winding has a plurality of candidate center taps surrounding the geometric center of the secondary winding, and wherein controlling the switched RC network comprises selectively connecting one of the candidate center taps, via the switched RC network, to a signal ground.

22. The method of claim 13, wherein the control input comprises a binary vector input, and wherein receiving a control signal at the control input comprises receiving a multi-bit control signal at the binary vector input.

23. The method of claim 13, wherein the circuit is included in a radio receiver, wherein the single-ended signal comprises a radio frequency signal, and wherein the differential signals comprise radio frequency signals.

24. The method of claim 13, wherein the circuit comprises part of a radio receiver, wherein receiving the single-ended signal comprises receiving a single-ended radio frequency signal, wherein generating the differential signals comprises generating differential radio frequency signals, wherein the method further includes converting the differential radio frequency signals into differential baseband signals, wherein detecting an output imbalance between the differential signals comprises detecting an output imbalance between the differential baseband signals, and wherein controlling the switched RC network comprises controlling the switched RC network to tune the output imbalance between the differential baseband signals responsive to the control signal.

* * * * *

UNITED STATES PATENT AND TRADEMARK OFFICE
CERTIFICATE OF CORRECTION

| | | |
|---|---|---|
| PATENT NO. | : 8,884,715 B2 | Page 1 of 1 |
| APPLICATION NO. | : 13/856465 | |
| DATED | : November 11, 2014 | |
| INVENTOR(S) | : Mu | |

It is certified that error appears in the above-identified patent and that said Letters Patent is hereby corrected as shown below:

In the Specification

In Column 1, Line 7, delete "which" and insert -- now Patent No. 8,436,695 which --, therefor.

In Column 2, Line 43, delete "network (SCRN)" and insert -- network (SRCN) --, therefor.

In Column 5, Line 31, delete "(SCRN) 26" and insert -- (SRCN) 26 --, therefor.

In Column 6, Line 18, delete "SCRN 44" and insert -- SRCN 44 --, therefor.

Signed and Sealed this
Fourth Day of August, 2015

Michelle K. Lee
*Director of the United States Patent and Trademark Office*